United States Patent
Krause et al.

(10) Patent No.: US 9,748,420 B2
(45) Date of Patent: Aug. 29, 2017

(54) HIGH ACCURACY MODULE ASSEMBLY PROCESS

(71) Applicant: Saint-Augustin Canada Electric Inc., Saint-Augistin (CA)

(72) Inventors: Rainer Krause, Mainz-Kostheim (DE); Eric Mazaleyrat, Crolles (FR)

(73) Assignee: Saint-Augustin Canada Electric Inc., Saint-Augustin, QC ( * ) Notice: Subject to any disclaimer, the term of this patent is extended or adjusted under 35 U.S.C. 154(b) by 0 days.

(21) Appl. No.: 14/780,752

(22) PCT Filed: Mar. 26, 2014

(86) PCT No.: PCT/EP2014/056091
§ 371 (c)(1),
(2) Date: Sep. 28, 2015

(87) PCT Pub. No.: WO2014/154768
PCT Pub. Date: Oct. 2, 2014

(65) Prior Publication Data
US 2016/0049527 A1   Feb. 18, 2016

(30) Foreign Application Priority Data
Mar. 29, 2013 (FR) .................... 13 52870

(51) Int. Cl.
| H01L 31/0232 | (2014.01) |
| H01L 31/024 | (2014.01) |
| H01L 31/052 | (2014.01) |
| H01L 31/054 | (2014.01) |
| H01L 31/0236 | (2006.01) |

(52) U.S. Cl.
CPC ...... *H01L 31/024* (2013.01); *H01L 31/02327* (2013.01); *H01L 31/02366* (2013.01); *H01L 31/052* (2013.01); *H01L 31/0543* (2014.12); *Y02E 10/52* (2013.01)

(58) Field of Classification Search
CPC ..... H01L 31/024; H01L 31/52; H01L 31/052; H01L 31/0543; H01L 31/02327; H01L 31/02366
USPC .................................................. 136/244, 246
See application file for complete search history.

(56) References Cited

U.S. PATENT DOCUMENTS 5,118,361 A    6/1992 Fraas et al.
6,415,977 B1 *  7/2002 Rumsey ............... H01L 23/544
                                                       235/454

(Continued)

FOREIGN PATENT DOCUMENTS

WO    2008073905 A2    6/2008

OTHER PUBLICATIONS

International Search Report for International Application No. PCT/EP2014/056091 dated Apr. 28, 3014, 3 pages.

(Continued)

*Primary Examiner* — Jayne Mershon
(74) *Attorney, Agent, or Firm* — TraskBritt (57) ABSTRACT

The present invention relates to an assembling method for a base plate of a concentrated photovoltaic module comprising the steps of: assembling a heat sink on the base plate; and assembling a photovoltaic cell assembly on the heat sink after the heat sink has been assembled on the base plate.

11 Claims, 8 Drawing Sheets

(56) References Cited

U.S. PATENT DOCUMENTS

| | | | |
|---|---|---|---|
| 2008/0135085 A1* | 6/2008 | Corrales | H02S 40/42 |
| | | | 136/246 |
| 2008/0135094 A1 | 6/2008 | Corrales | |
| 2008/0185034 A1* | 8/2008 | Corio | H01L 31/042 |
| | | | 136/246 |
| 2009/0120500 A1* | 5/2009 | Prather | H01L 31/048 |
| | | | 136/259 |
| 2009/0223555 A1 | 9/2009 | Ammar | |
| 2013/0319507 A1* | 12/2013 | Hasin | H01L 31/18 |
| | | | 136/246 |
| 2014/0026939 A1* | 1/2014 | Martin | H01L 31/02008 |
| | | | 136/246 |
| 2014/0048128 A1* | 2/2014 | Meitl | H01L 31/0525 |
| | | | 136/255 |
| 2015/0027509 A1 | 1/2015 | Levin | |

OTHER PUBLICATIONS

French Preliminary Search Report for French Application No. 1352870 dated Oct. 211, 2013, 8 pages.
Chinese Office Action and Search Report for Chinese Application No. 201480024029.1 dated Jun. 29, 2016, 6 pages.
Written Opinion of the International Searching Authority for International Application No. PCT/EP2014/056091 dated Apr. 28, 3014, 3 pages.
International Preliminary Report on Patentability for International Application No. PCT/EP2014/056091 dated Sep. 29, 2015, 4 pages.

* cited by examiner

HIGH ACCURACY MODULE ASSEMBLY PROCESS

CROSS-REFERENCE TO RELATED APPLICATIONS

This application is a national phase entry under 35 U.S.C. §371 of International Patent Application PCT/EP2014/056091, filed Mar. 26, 2014, designating the United States of America and published in English as International Patent Publication WO 2014/154768 A1 on Oct. 2, 2014, which claims the benefit under Article 8 of the Patent Cooperation Treaty and under 35 U.S.C. §119(e) to French Patent Application Serial No. 1352870, filed Mar. 29, 2013, the disclosure of each of which is hereby incorporated herein in its entirety by this reference.

TECHNICAL FIELD

This disclosure generally relates to the field of photovoltaic electricity generators. In particular, it relates to an assembling method for a base plate of a concentrated photovoltaic module.

BACKGROUND

In recent years, due to the increase of costs associated with producing electricity from fossil fuels, renewable energy technology has gained interest. In particular, among the plurality of renewable energy technologies, Concentrated Photovoltaic (CPV) technology has been the subject of much research. The advantage of CPV over the non-concentrated photovoltaic technology results from the fact that CPV can produce the same amount of electricity of a much larger non-concentrated photovoltaic cell by focusing the sunlight via a lens on a smaller active semiconductor area. In particular, Fresnel lenses are used for CPV technology. As a result of this approach, it is possible to reduce the costs associated with the manufacturing of the photovoltaic cell since the materials used are reduced.

However, by concentrating the sunlight in such a manner, CPV systems have a tendency to increase their temperature during operation. This negatively affects the efficiency of the photovoltaic conversion. Accordingly, it is often necessary to position CPV cells on top of structures capable of removing excessive heat from the cells, such as passive or active heat sinks.

The CPV cell is, therefore, usually assembled on top of a heat sink, which is thereafter assembled on top of a base plate of a solar module. The module is then further completed by the lenses concentrating sunlight on the CPV cells. Such arrangement requires a plurality of steps at the assembly manufacturing plant, which may introduce a misalignment between the lens and the CPV cell, resulting in poor efficiency of the module.

Figure 4:
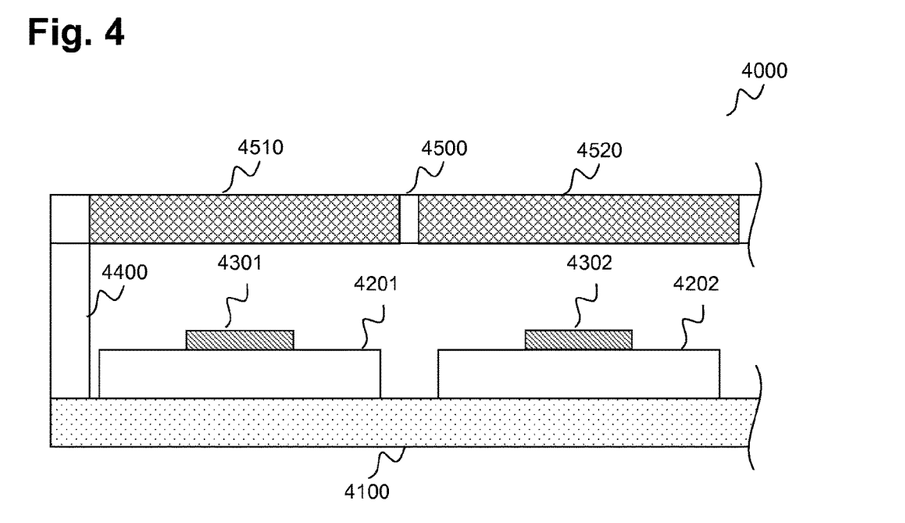
FIGS. 4 and 4A schematically illustrate a photovoltaic module.

In particular, as schematically illustrated in FIG. 4, a photovoltaic module 4000 comprises a base plate 4100, on top of which a plurality of heat sinks 4201 and 4202 are mounted. Each of the heat sinks has a CPV cell 4301, 4302 mounted thereon. The photovoltaic module 4000 further comprises a module structure, here schematically represented by a pillar 4400, which sustains lenses layer 4500, comprising lenses 4510 and 4520. Accordingly, when exposed to sunlight, the light is concentrated by lenses 4510 and 4520 on CPV cells 4301 and 4302, respectively. The CPV cells 4301 and 4302 transform sunlight into electricity, but also heat up while being illuminated, since they do not have an ideal 100% efficiency. The excess heat is removed by means of heat sinks 4201 and 4202, respectively.

Figure 4A:
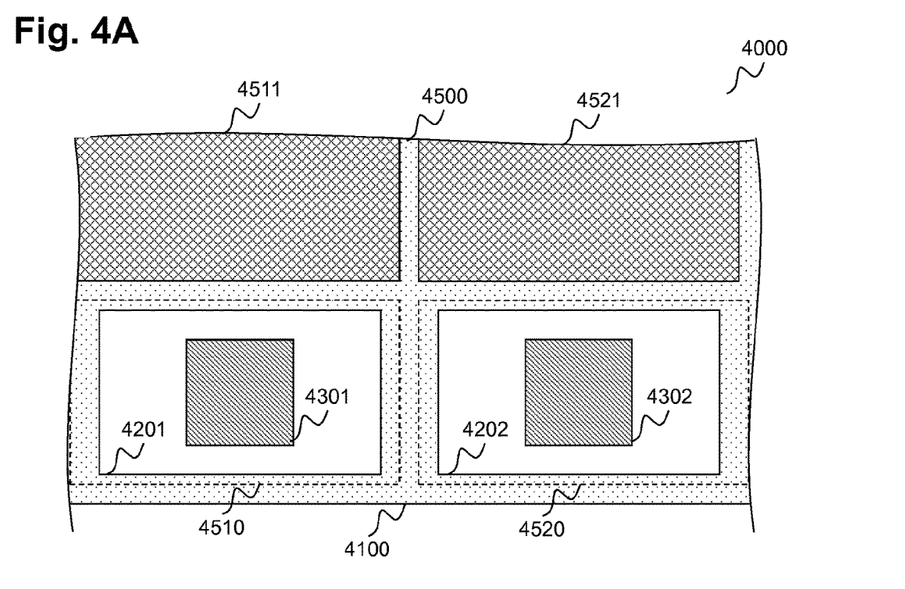

FIG. 4A schematically illustrates a top view of photovoltaic module 4000. In particular, in FIG. 4A, four CPV cells are illustrated. However, for clarity of representation, the top two are illustrated with the lenses 4510 and 4521 in place, while lenses 4510 and 4520 for the bottom two CPV cells have been represented only by dashed lines. In a non-limitative way, lenses 4510 and 4520 are represented schematically in a rectangular shape, but can have any other suitable shape, and can be, for instance, square-shaped Fresnel lenses commonly used for CPV.

FIGS. 4 and 4A illustrate the ideal placement of CPV cells with respect to the corresponding lens, for achieving maximum efficiency of the photovoltaic module 4000. However, such ideal placement is hindered in practice by the assembling process, illustrated in FIG. 5.

Figure 5:
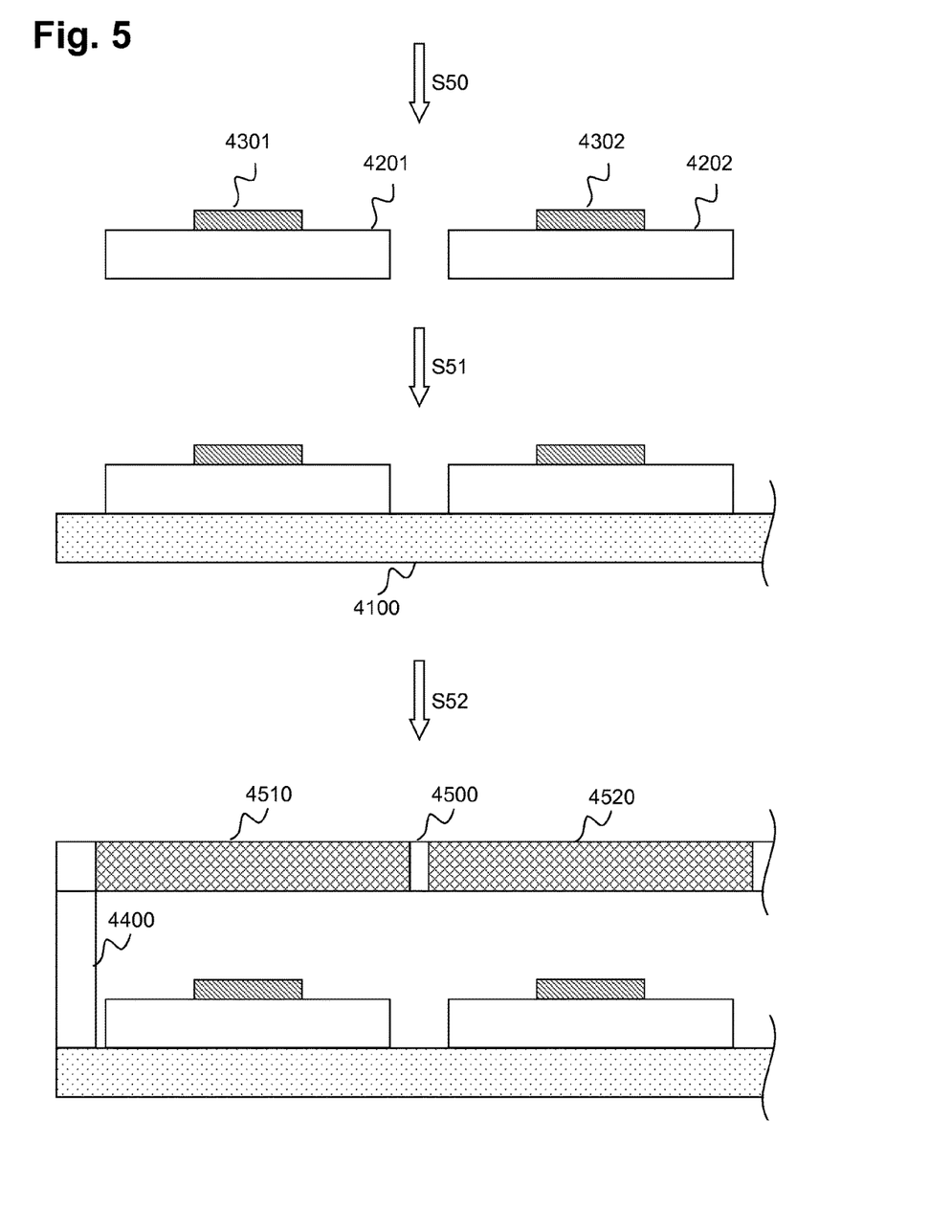
FIG. 5 schematically illustrates a photovoltaic module and base plate assembly methods.
Figure 6:
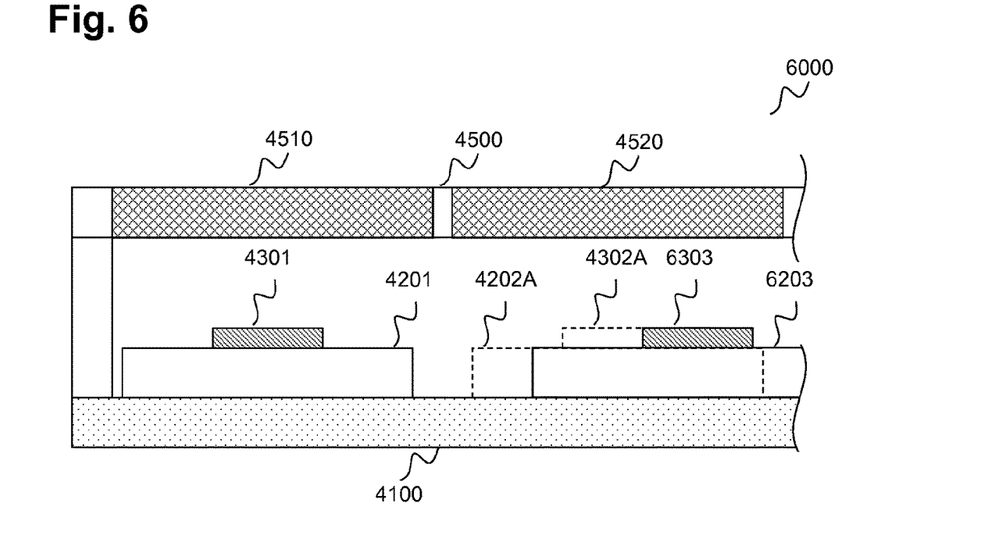
FIGS. 6 and 6A schematically illustrate a photovoltaic module.
Figure 6A:
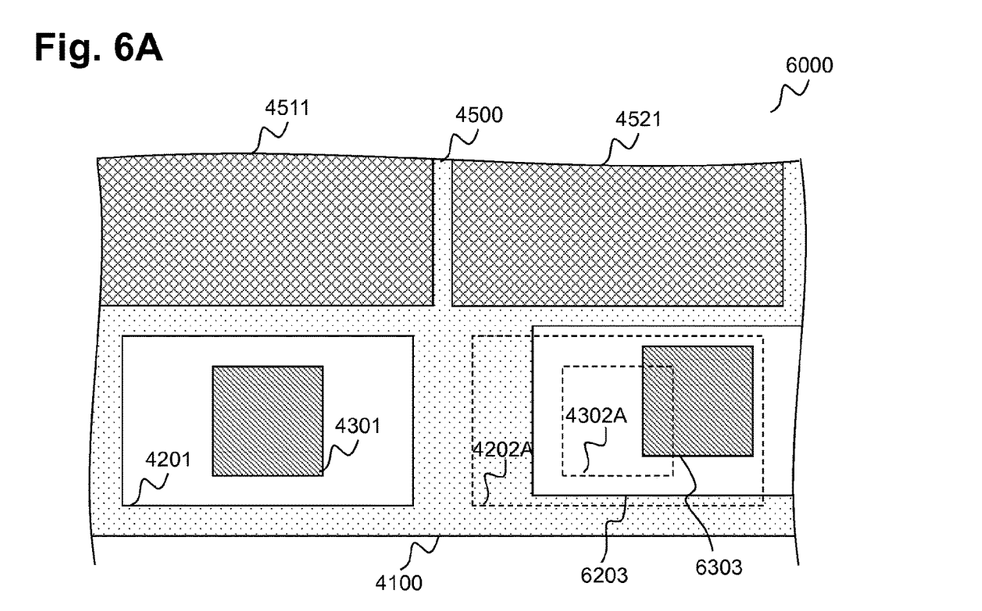

As can be seen in FIG. 5, the assembling process usually starts with (i) the placement of CPV cells 4301, 4302, on top of respective heat sinks 4201, 4202, in a step S50. This is subjected to a first misalignment error, which could be, for instance, in the range of +/−10 μm. The structures so realized are then placed on the base plate 4100 via a step S51. This is subjected to a second misalignment error, which could be, for instance, in the range of +/−10 μm. During a subsequent step S52, the addition of a module structure or pillar 4400 and a lenses layer 4500 result in the placement of lenses 4510 and 4520 over the CPV cells 4301 and 4302. This is subjected to a third misalignment error. This process can, therefore, be subjected to several misalignment errors, occurring at each of the assembly steps. For instance, FIGS. 6 and 6A illustrate a photovoltaic module 6000, a case in which the CPV cell 6303 and heat sink 6203 are misaligned, with respect to their respective ideal positions 4302A and 4202A. In this case, the misalignment introduced at any of steps S50-S52 results in a final misalignment between the lens 4520 and the CPV cell 6303, thereby decreasing the efficiency of module 6000.

The above-mentioned problems are solved by the teaching of this disclosure.

BRIEF SUMMARY

In particular, this disclosure can relate to an assembling method for a base plate of a concentrated photovoltaic module comprising the steps of: assembling a heat sink on the base plate and assembling a photovoltaic cell assembly on the heat sink after the heat sink has been assembled on the base plate.

This provides the beneficial advantage that the heat sink can be assembled with a misalignment error that does not add to the misalignment error of assembling of the photovoltaic cell assembly on the heat sink. In particular, since the latter step is carried out after the heat sink is in place, the position of the heat sink is not a cause of added misalignment, but only the misalignment of the photovoltaic cell assembly contributes to the final misalignment.

In further advantageous embodiments, the base plate assembling method can further comprise the step of marking the heat sink, once assembled on the base plate, with position markings indicating a mounting position of the photovoltaic cell assembly; and wherein the step of assembling the photovoltaic cell assembly on the heat sink is carried out by using the position markings for the alignment of the assembling.

This provides the beneficial effect that the position of the photovoltaic cell assembly can be precisely controlled with respect to the markings during its assembling in the concentrated photovoltaic module, thereby increasing the efficiency of the module. In particular, since the markings can be done after the heat sink is put in place, the misalignment error of the heat sink on the base plate can be corrected by a precise positioning of the markings.

In further advantageous embodiments, the photovoltaic cell assembly may comprise a photovoltaic cell.

This provides the beneficial effect that the mounting of the concentrated photovoltaic module is simplified, since the markings on the heat sinks can, for instance, be made by laser in order to result in the focusing region of the lens, which corresponds to the region in which the photovoltaic cell should be mounted.

In further advantageous embodiments, the photovoltaic cell assembly may further comprise a semiconductor structure on which the photovoltaic cell is assembled.

This provides the beneficial effect that additional electrical structures, such as a bypass diode, can be realized in the semiconductor structure. Additionally, if the semiconductor structure is bigger than the photovoltaic cell, this further facilitates the handling of the photovoltaic cell assembly. Further, as the photovoltaic cell assembly, comprising a semiconductor structure, could contain all necessary electrical connections, also for the interconnection of neighboring cells, the assembly on the heat sink only requires a good thermal contact, and not, as habitually used, a combined good thermal and electrical contact.

In further advantageous embodiments, the method can further comprise the step of assembling the photovoltaic cell on the semiconductor structure with a semiconductor manufacturing process.

This provides the beneficial effect that precise alignment of the photovoltaic cell on the semiconductor structure can be achieved.

In further advantageous embodiments, the step of marking the heat sink can comprise marking the heat sink with position markings based on a position of a lens of the concentrated photovoltaic module.

In this manner, based on the position of the lens, precise markings can be achieved, thus increasing the alignment of all the photovoltaic cell assemblies of the module as a whole, and leading to a decrease in misalignment due to the positioning of the lens plate.

In further advantageous embodiments, the position marking can be obtained by a laser.

In further advantageous embodiments, the position of a lens can be determined with respect to a common reference point between the lenses layer and the base plate.

This provides the beneficial advantage that the position coordinates of the focal points of each lens of the lens plate, also referred to as "lenses layer," which can be measured and recorded independently prior to the final assembly, can be used for the position marking on the heat sinks on the base plate.

In further advantageous embodiments, the assembling of the photovoltaic cell assembly on the heat sink can be realized by means of gluing and/or laser welding.

This provides the beneficial effect that a stable positioning of the photovoltaic cell assembly on the heat sink can be realized, which also allows a very good heat transfer between the two elements.

Further, this disclosure can relate to a base plate for a concentrated photovoltaic module comprising at least one heat sink, wherein the heat sink is marked with position markings indicating a mounting position of a photovoltaic cell assembly.

Moreover, this disclosure can relate to a concentrated photovoltaic module comprising a base plate in accordance with the embodiment above and at least one of a photovoltaic cell assembly and a lens.

BRIEF DESCRIPTION OF THE DRAWINGS

The disclosure will be described in more detail hereinafter, by way of example, using advantageous embodiments and with reference to the drawings. The described embodiments are only possible configurations in which the individual features may, however, as described above, be implemented independently of each other or may be omitted. Equal elements illustrated in the drawings are provided with equal reference signs. Parts of the description relating to equal elements illustrated in the different drawings may be left out. In the drawings.

DETAILED DESCRIPTION

This disclosure will now be described with reference to specific embodiments. It will be apparent to the skilled person that features and alternatives from any of the embodiments can be combined, independently of each other, with features and alternatives of any other embodiment.

Figure 1:
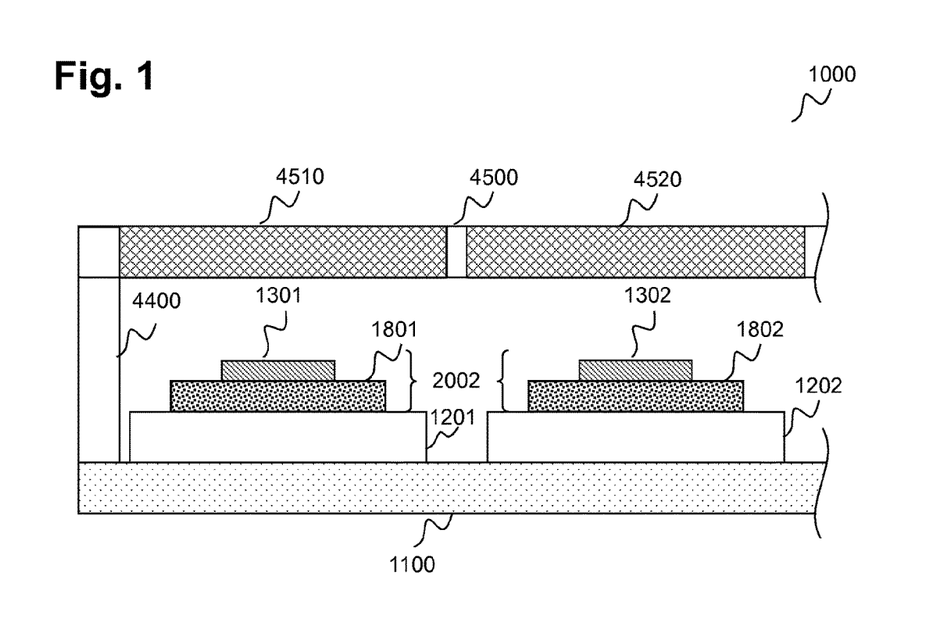
FIGS. 1 and 1A schematically illustrate a photovoltaic module and a base plate in accordance with embodiments of this disclosure.
Figure 1A:
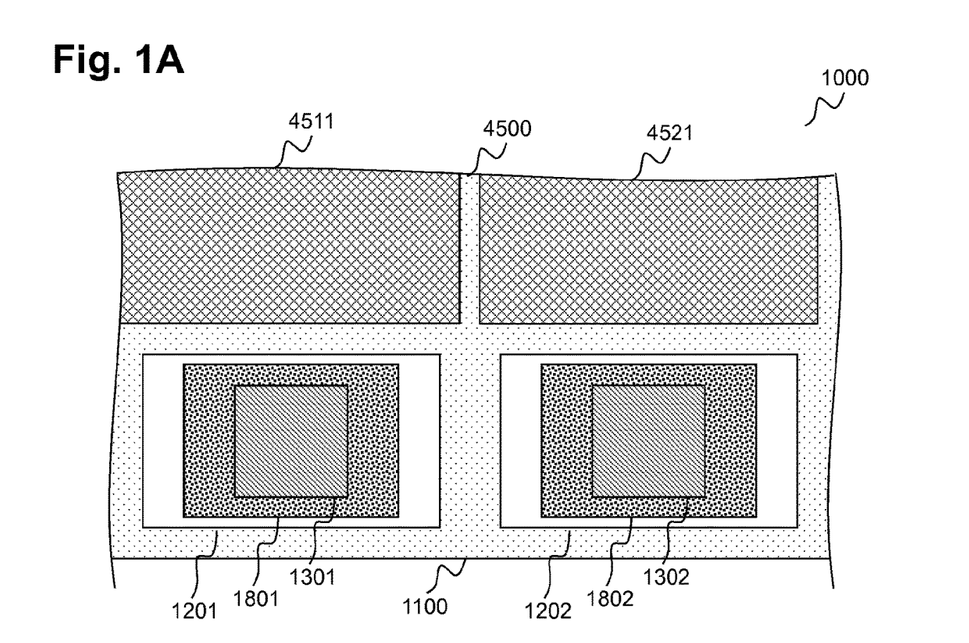

In particular, FIG. 1 illustrates a cross-sectional view and FIG. 1A depicts a top view of a concentrated photovoltaic (CPV) module 1000 comprising a base plate 1100 in accordance with an embodiment of this disclosure.

Concentrated photovoltaic module 1000 comprises a base plate 1100, at least one heat sink 1201 and/or 1202, and a lens layer 4500. The lens layer 4500 comprises at least one lens 4510 and/or 4520, concentrating sunlight on top of photovoltaic cell assemblies 2002 comprising photovoltaic cell 1301, 1302 and semiconductor structure 1801, 1802.

Figure 2:
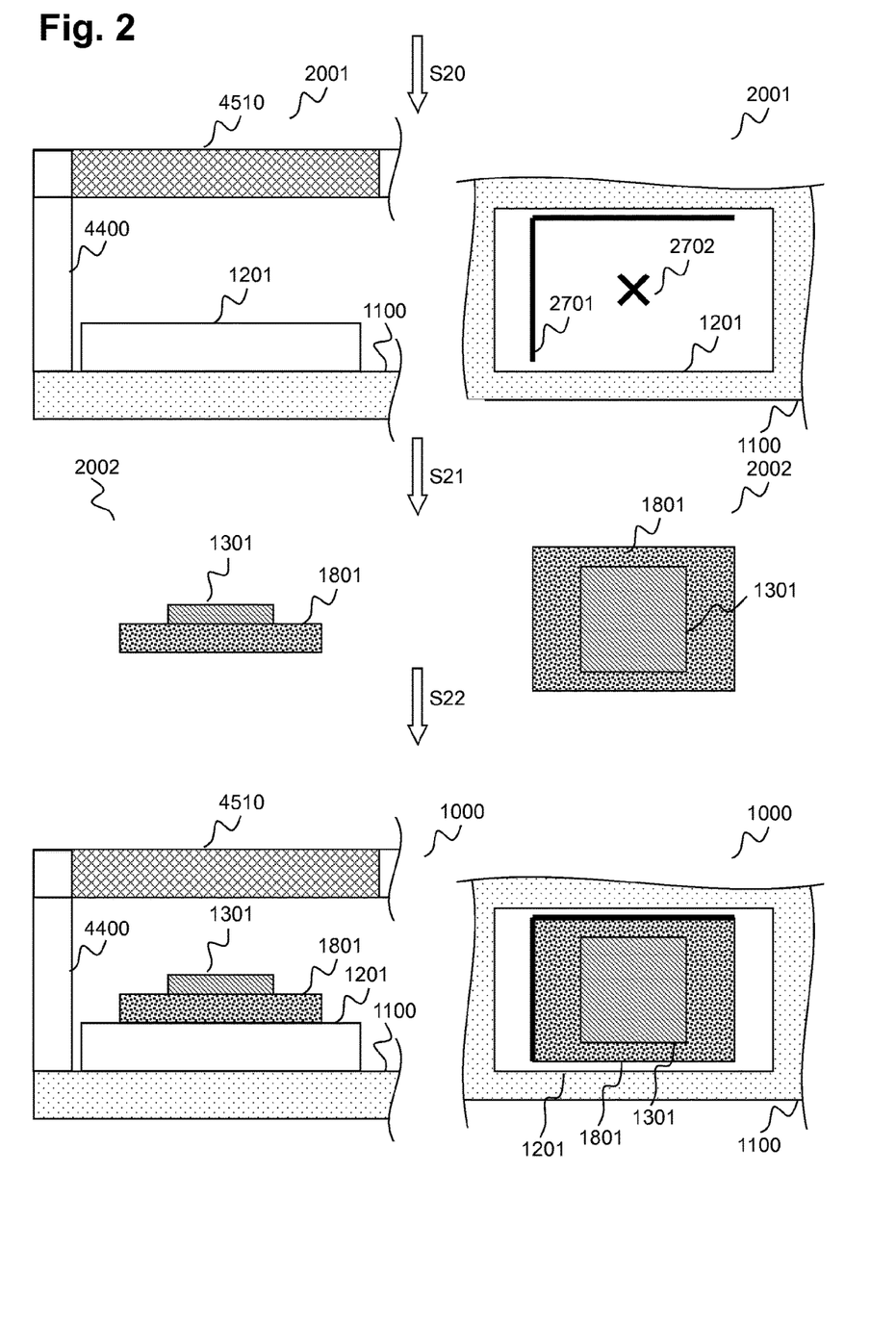
FIG. 2 schematically illustrates a photovoltaic module and base plate assembly methods in accordance with embodiments of this disclosure.

The CPV module 1000 is assembled, as described in FIG. 2, with an assembling method that reduces the potential misalignment between the photovoltaic cell 1301, 1302 and the lens 4510, 4520, respectively.

In particular, FIG. 2 schematically represents steps of an assembling method of a base plate and the corresponding module in accordance with embodiments of this disclosure. More specifically, on the left side of FIG. 2, cross-sectional views of the different components of the CPV module 1000 during the assembling method is represented. On the right side of FIG. 2, the corresponding top view is illustrated. As in the case of FIGS. 1A and 6, the lens 4510 is not illustrated in the top view, so as to allow the lower layers to be seen.

A module is realized comprising a module structure, here schematically represented by a pillar 4400, a heat sink 1201 on top of base plate 1100 and a lens 4510.

Concerning the specific assembling of the base plate, a heat sink 1201 can be mounted on the base plate 1100 in several manners, such as by gluing, welding, or screwing, as long as the assembling of the heat sink 1201 is such that further movement relative to the base plate 1100 is prevented. This step is realized prior to the assembling, on top of the heat sink 1201, of the photovoltaic cell assembly 2002. This is advantageous, since the photovoltaic cell assembly 2002 can then be assembled in its ideal position, without being affected by any potential misalignment of the heat sink 1201.

During an optional marking step S20, after assembling of the heat sink 1201 on base plate 1100, position markings 2701 and 2702 are realized in the heat sink 1201. The position markings illustrated in FIG. 2 comprise a first position marking 2701 having a corner shape and a second position marking 2702 having a cross shape.

Alternatively, during step S20, the lenses layer 4500 and the module structure are not yet necessarily present and can be assembled to the base plate later, as described below with reference to FIG. 2D.

The second position marking 2702 can be used for the subsequent alignment of the photovoltaic cell assembly 2002 and/or for the deposition of a contact paste and/or a glue, in case the photovoltaic cell assembly 2002 is kept in place on the heat sink 1201 in such a manner. The first position marking 2701 can be used for the subsequent alignment of the photovoltaic cell assembly 2002, for instance, by having two sides of the photovoltaic cell assembly 2002 overlapping with the two lines and lining up with the first marking 2701.

In general, the position and shape of the markings can be realized in any manner that will allow a manual and/or automatic alignment of the photovoltaic cell assembly 2002 with respect to the marks. Exemplary techniques for the realization of the markings 2701 and/or 2702 will be described below with reference to FIGS. 2A-2C.

During step S21, the photovoltaic cell assembly 2002 is assembled by placing the photovoltaic cell 1301 on semiconductor structure 1801. The assembling step S21 is not necessarily carried out after the step S20. In particular, while step S20 could be carried out at the base plate manufacturing plant, the step S21 could be carried out independently at the photovoltaic cell manufacturing plant. As described above, as a result of the precision of the instruments used during semiconductor manufacturing, as opposed to the instruments used during assembling of the CPV module 1000, the relative placement of the semiconductor structure 1801 and of photovoltaic cell 1301 could be achieved in the range of micrometers or lower, thereby effectively resulting in an ideal alignment between the semiconductor structure 1801 and of photovoltaic cell 1301.

In a subsequent step S22, the photovoltaic cell assembly 2002 is mounted on the module 2001 in some embodiments by using the markings 2701 and 2702 for the positioning and alignment of the photovoltaic cell assembly 2002.

Figure 3:
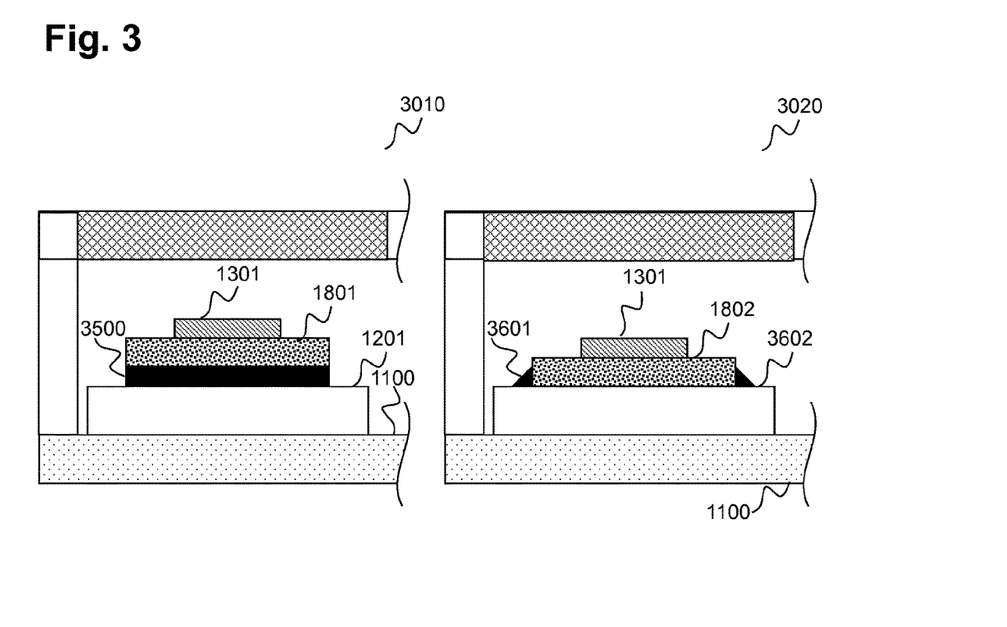
FIGS. 3 and 3A schematically illustrate photovoltaic modules in accordance with embodiments of this disclosure.

In particular, with respect to the exemplary markings 2701 and 2702 illustrated in FIG. 2, marking 2702 is used for pouring of a contact paste and/or glue 3500, as schematically illustrated in FIG. 3, used to stably mount photovoltaic cell assembly 2002 on the heat sink 1201. Additionally, marking 2701 is used by making the sides of photovoltaic cell assembly 2002 to align with the marking 2701, in order to align the photovoltaic cell assembly 2002.

As for step S20, during step S22, the lenses layer 4500 and the module structure 4400 can be removed or is not yet necessarily present and can be assembled later, as described below with reference to FIG. 2D, so as to facilitate the placement of the photovoltaic cell assembly 2002. In this case, the lenses layer 4500 and the module structure 4400 are designed in such a manner that the lenses layer 4500 can be subsequently placed or replaced on the module structure 4400 without losing its relative placement, with respect to the heat sink 1201, that was used during the marking step S21. For instance, the relative placement of the lens plate, also referred to as lenses layer, to the base plate can be assured by using the exact position coordinates of the focal points of each lens on an individual lenses layer, which can be measured and recorded independently from the latter assembling during an illumination step. These coordinates can be either used with respect to the position of the module structure or with respect to the edges of the lenses layer or another convenient reference common to the lens and base plate. Each coordinate's values of each individual lens plate, registered with the serial number of the lens plate, assures the assembling to the respective base plate on which the position markings have been realized using the respective coordinates values. Therefore, an easy control via the manufacturing execution system is provided and assures the perfect alignment of the markings on the heat sink on a base plate with the focal point of the lenses of the respectively used lens plate.

Although the base plate 1100 above has been described as being integrally formed with the module structure 4400, this disclosure is not limited thereto. Alternatively, or in addition, a module could comprise an independent module structure 4400, within which the base plate 1100 is placed during the assembling of the module.

Figure 2A:
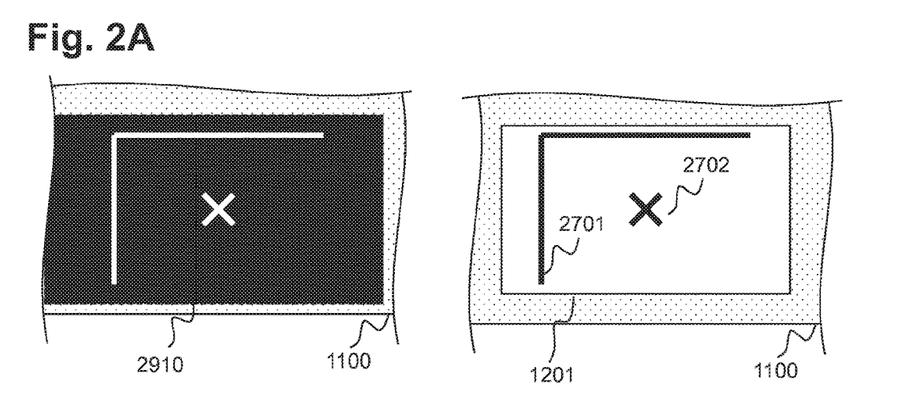
FIGS. 2A-2C schematically illustrate exemplary techniques for obtaining markings on the heat sink in accordance with embodiments of this disclosure.
Figure 2B:
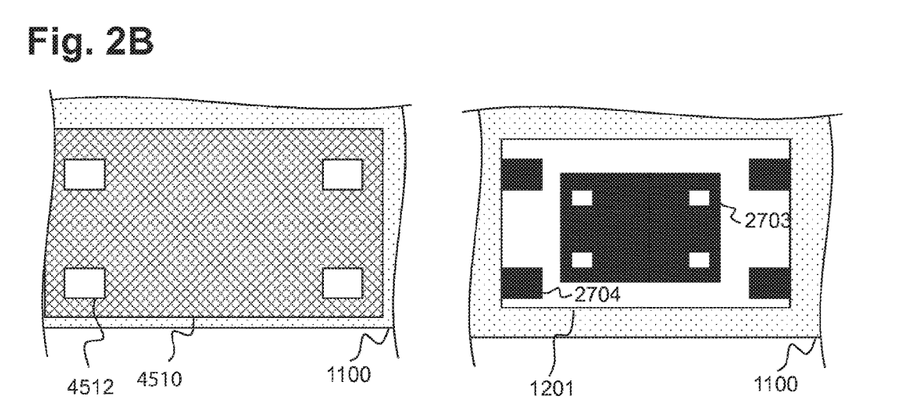
Figure 2C:
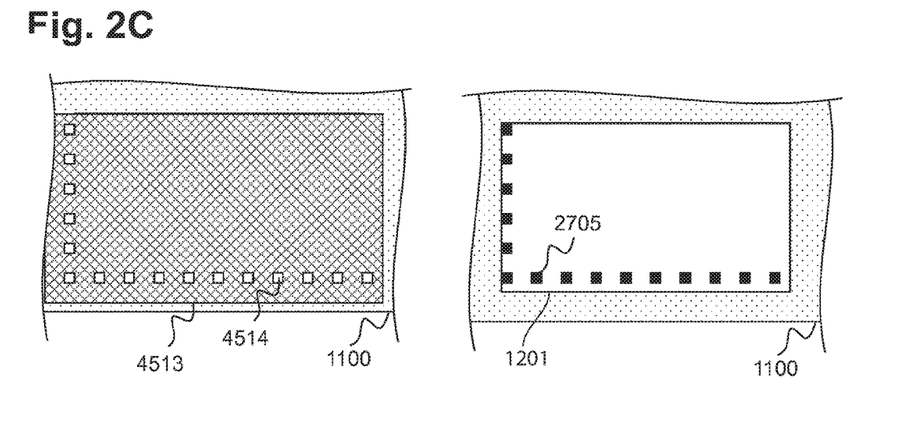
Figure 2D:
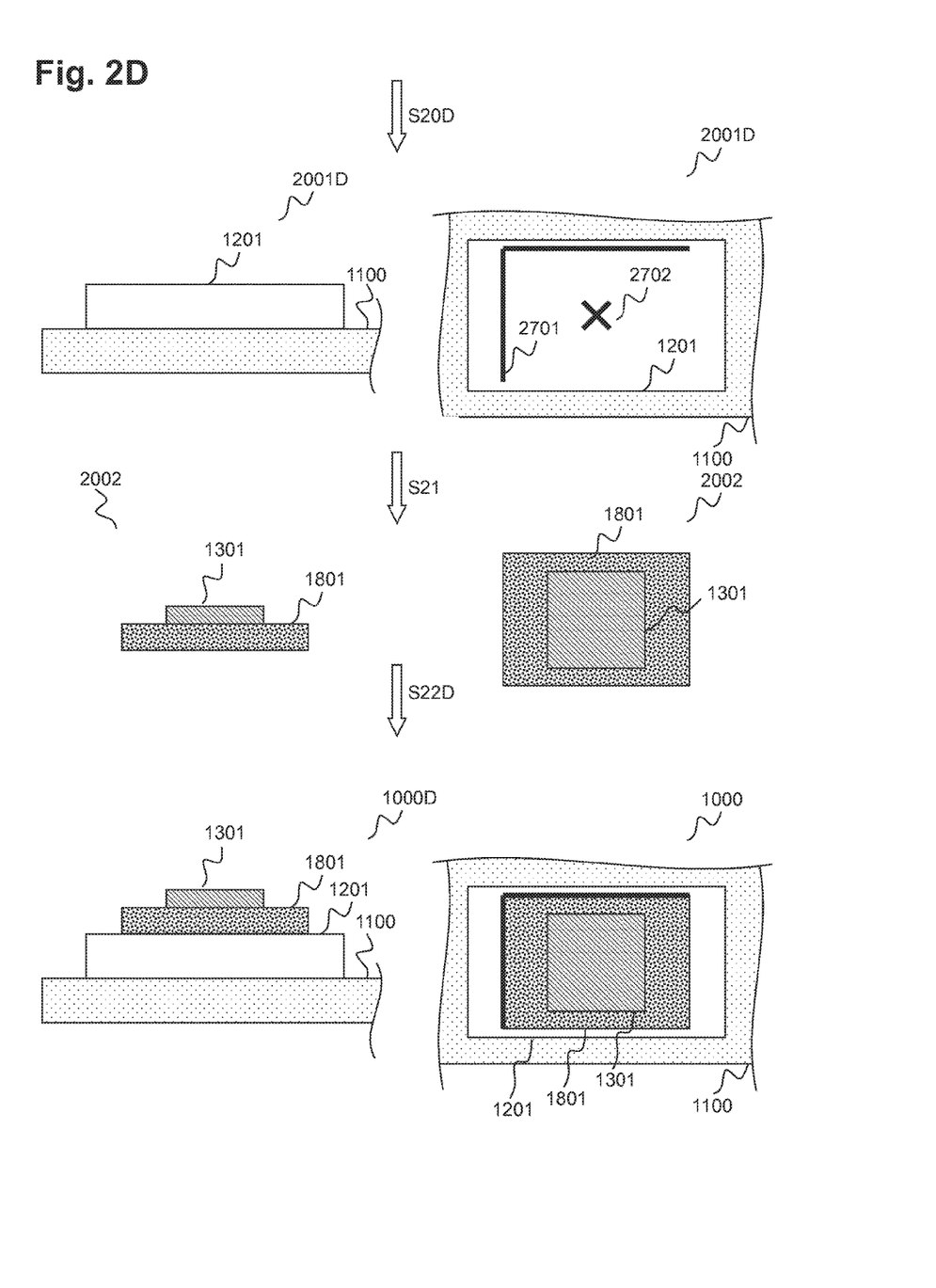
FIG. 2D schematically illustrates a base plate assembly method in accordance with an embodiment of this disclosure.

In particular, as illustrated in FIG. 2D, an embodiment of this disclosure comprises the realization of a structure 1000D, comprising the base plate 1100, the heat sink 1201, and the photovoltaic cell assembly 2002. Even more specifically, FIG. 2D illustrates an assembling method for the base plate 1100, in which the heat sink 1201 is placed on top of the base plate 1100, in a first assembling step, not illustrated. During an optional step S20D, markings 2701 and 2702 are realized, thereby obtaining marked structure 2001D. Step S21 corresponds to the same step S21 described with reference to FIG. 2, in which the photovoltaic cell assembly 2002 is assembled, by placing the photovoltaic cell 1301 on semiconductor structure 1801. As for FIG. 2, step S21 is not necessarily carried out after step S20D. For instance, while step S20 could be carried out at the base plate manufacturing plant, the step S21 could be independently carried out at the photovoltaic cell manufacturing plant. Finally, during an assembling step S22D, the photovoltaic cell assembly 2002 is mounted on the structure 2001D, by using the markings 2701 and 2702, if optional step S20D was carried out, for the positioning and alignment of the photovoltaic cell assembly 2002.

The procedure illustrated in FIG. 2D, therefore, achieves a structure 1000D comprising the base plate 1100, the heat sink 1201, and the photovoltaic cell assembly 2002, wherein the misalignment error of the heat sink 1201 with respect to the base plate 1100 does not negatively affect the total misalignment of the photovoltaic cell assembly 2002. The structure 1000D can then subsequently be integrated into a CPV module 1000 by placing it into a module structure 4400 (FIG. 1) and adding lenses layer 4500 (FIG. 1).

FIGS. 2A-2C schematically illustrate exemplary techniques for obtaining the markings 2701-2705 or, more generally, any markings on the heat sink 1201 defining the relative position of the lens 4510 with respect to the heat sink 1201.

More specifically, on the left side of FIGS. 2A-2C, a top view of the different components of the CPV module 1000 during the marking step is represented. On the right side of FIGS. 2A-2C, the resulting marking is illustrated.

The markings can be realized by any technique that allows the position of the markings to relate to the position of the lens. In particular, since the relative position of the lens 4510 and of the photovoltaic cell 1301 is what affects the efficiency of the CPV module 1000, the positioning of the heat sink 1201 is less critical than the relative position of the lens 4510 and of the photovoltaic cell 1301.

In FIG. 2A, the markings are realized by replacing the lens layer 4500 with a masks layer. The masks layer has a plurality of masks 2910, each one having the same positioning of a lens 4510, 4520. The masks 2910 have holes corresponding to markings 2701, 2702. In this manner, the laser light can only go through the holes in the mask 2910, thereby resulting in markings 2701, 2702 being impressed on the heat sink 1201.

Alternatively, or in addition, the holes in mask 2910 could be realized such that the markings represent the desired placement of the photovoltaic cell assembly 2002 (FIG. 2), or could represent the corners of photovoltaic cell assembly 2002, or could represent the position of specific border points of the photovoltaic cell assembly 2002, such as midpoints of each of the sides or similar.

Alternatively, or in addition, the laser marking could be carried out through the lens 4510, as illustrated in FIG. 2B.

In particular, lens 4510 could be realized so as to have one or more transparent, non-focusing regions 4512, at some predetermined places, such as the corners, etc. In this manner, a vertically incident laser light would result in a marking 2703 on the heat sink 1201 corresponding to the focusing region of lens 4510, with additional alignment markings 2704 corresponding to the transparent, non-focusing regions 4512.

Still alternatively, or in addition, without the presence of regions 4512, the marking 2703 could be sufficient for placing and aligning the photovoltaic cell assembly 2002 (FIG. 2). In particular, the lens 4510 could be realized so as to focus all incoming light in a region 2703 corresponding to the desired placement of the photovoltaic cell 1301 on (FIG. 1) heat sink 1201. By irradiating the whole lens 4510 with a perpendicular laser, the resultant marking on heat sink 1201 would then be obtained without knowing the position of the lens' center, but could be used in order to center the photovoltaic cell assembly 2002.

Still alternatively, or in addition, the marking through the lens 4510 could be operated by instructing the laser to mark the heat sink 1201 by measuring the position of the marking with respect to the placement of the lens. For instance, if the lens is constructed such as to vertically focus rays going through its center, the laser could measure the position of the lens, identify the center of the lens, and then carry out a laser marking process through the lens center. This would result in the heat sink 1201 being marked in a spot corresponding to the vertical projection of the lens center. Such marking could then be used during the mounting of the photovoltaic cell assembly 2002.

Generally, it will be clear to those skilled in the art that, for each focusing scheme of a given lens 4510, a laser marking process can be designed such that the heat sink 1201 will be marked in a way that impresses, on the heat sink 1201, markings 2701 and/or 2702, providing information on the relative position of the lens 4510 and of the heat sink 1201.

It will also be clear that the lens can be designed in such a manner that the focusing of the laser wavelength is at a focal distance corresponding to the top plane of the heat sink 1201, while the focusing of the sunlight is at a focal distance corresponding to the top plane of the photovoltaic cell 1301. In this manner, it is possible to achieve a precise marking 2701, 2702, 2703, 2704, as well as efficiently focus the sunlight on the photovoltaic cell 1301.

Still alternatively, or in addition, the heat sink could be covered in a photosensible material, such that other illumination systems, such as sunlight, can be used to impress markings on the photosensible material.

Alternatively, or in addition, the markings could be realized in another manner, such as mechanically. For instance, as illustrated in FIG. 2C, a lens 4513 having one or more holes 4514 could be put in place as a final lens or as a processing lens to be then replaced by lens 4510, and a drill could be passed through the openings 4514 so as to produce markings 2705 on the heat sink 1201.

Alternatively, or in addition, marking techniques, such as, for instance, mechanical scribing or stamping techniques, can be realized.

Alternatively, or in addition, the lenses layer 4500 and the module structure are not yet necessarily present and can be assembled to the base plate later, and the marking of the heat sinks can be realized without the presence of the lenses layer but only by taking into account the position coordinates of the focal points of each lens, which could be measured and recorded independently for each individual lenses layer.

Although the base plate 1100 above has been described as being integrally formed with the module structure 4400, this disclosure is not limited thereto. Alternatively, or in addition, a module could comprise an independent module structure 4400, within which the base plate 1100 is placed during the assembling of the module.

Alternatively, or in addition, the markings could be realized on the heat sink 1201 with respect to the heat sink itself. For instance, with knowledge, from the design of the module, of the focusing positions of the lenses on top of the heat sinks assembled on the base plate, the heat sinks could be marked without using the lenses in order to provide position information, but with respect to the ideal position of the lenses.

Alternatively, or in addition, the markings could be realized on the heat sinks 1201 with respect to the position of the module structure 4400, which is precisely related to the positioning of the lenses that are assembled in a highly accurate and controlled manner on the same module structure.

Accordingly, generally, any marking procedure that will realize a marking 2701-2705 on the heat sink 1201, which allows the determination of the position of a predetermined point of lens 4510, once mounted on the module 1000, preferably the focusing point, with respect to heat sink 1201, can be used.

As a result of this approach, the photovoltaic cell assembly 2002 can be reliably mounted on the heat sink 1201 in a position that is precisely known, with respect to the position of the lens 4510, such that efficiency of the CPV module 1000 is increased. In particular, even if the placement of the heat sink 1201 with respect to the base plate 1100 is not precise, this does not affect this disclosure.

Figure 3A:
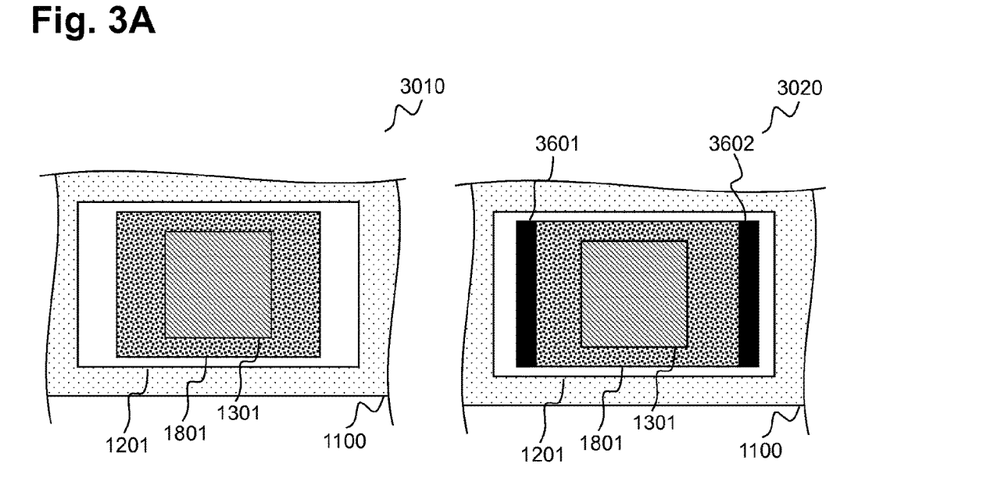

FIGS. 3 and 3A schematically illustrate a photovoltaic module 3010 and 3020 in accordance with embodiments of this disclosure. In particular, while FIG. 3 illustrates the cross-sectional view of the modules, FIG. 3A illustrates the corresponding top view, without the lens 4510.

As can be seen in FIGS. 3 and 3A, the solar cell assembly 2002 can be fixed to the heat sink 1201 via the glue and/or contact paste 3500, which can be deposited on the heat sink 1201 precisely, with the help of markings 2702 (FIG. 2).

Alternatively, or in addition, the solar cell assembly 2002 can be fixed to the heat sink 1201 via a laser welding 3601, 3602.

Although in the above-described embodiments the photovoltaic cell assembly has been illustrated as being mounted on top of heat sink 1201, this disclosure is not limited thereto. Alternatively, or in addition, one or more of the photovoltaic cell assemblies of the photovoltaic module could be mounted directly on the base plate 1100. In this case, the base plate 1100 would act as heat sink 1201 and as a structural element of the photovoltaic module at the same time. Accordingly, in this case, the markings 2701 and 2702 would be realized on the base plate 1100.

Additionally, although in the above-described embodiments the photovoltaic cell assembly has been illustrated as comprising a plurality of heat sinks 1201, 1202, this disclosure is not limited thereto. Alternatively, only a single, possibly continuous, heat sink could be used on top of base plate 1100 as a mounting point for one or more of the photovoltaic cell assemblies 2002.

Furthermore, although in the above-described embodiments, the photovoltaic cell assembly 2002 has been illustrated as comprising both a photovoltaic cell 1301 and a semiconductor structure 1801, this disclosure is not limited thereto. Alternatively, or in addition, one or more of the photovoltaic cell assemblies of the photovoltaic module could comprise only the photovoltaic cell 1301 mounted directly on top of the heat sink 1201.

Moreover, although alternative approaches have been described with respect to one or more specific embodiments, it will be clear to those skilled in the art, that those alternative approaches can be applied to all other above-described embodiments, independently or in combination with each other.

The invention claimed is:

1. A method comprising the steps of:
   assembling a heat sink on a base plate of a concentrated photovoltaic module; and
   assembling a photovoltaic cell assembly on the heat sink after the heat sink has been assembled on the base plate;
   wherein the method further comprises a step of marking the heat sink, once assembled on the base plate, with position markings indicating a mounting position of the photovoltaic cell assembly;
   wherein the step of assembling the photovoltaic cell assembly on the heat sink is carried out by using the position markings for the alignment of the photovoltaic cell assembly.

2. The method according to claim 1, wherein the photovoltaic cell assembly comprises a photovoltaic cell.

3. The method according to claim 2, wherein the photovoltaic cell assembly further comprises a semiconductor structure on which the photovoltaic cell is assembled.

4. The method according to claim 3, further comprising the step of assembling the photovoltaic cell on the semiconductor structure with a semiconductor manufacturing process.

5. The method according to claim 4, wherein the step of marking the heat sink comprises marking the heat sink with position markings based on a position of a lens of the concentrated photovoltaic module.

6. The method according to claim 5, wherein the position marking is obtained by a laser.

7. The method according to claim 5, wherein the position of a lens is determined with respect to a common reference point between a lenses layer and the base plate.

8. The method according to claim 7, wherein the assembling of the photovoltaic cell assembly on the heat sink is realized by means of gluing and/or laser welding.

9. The method according to claim 1, wherein the step of marking the heat sink comprises marking the heat sink with position markings based on a position of a lens of the concentrated photovoltaic module.

10. The method according to claim 3, wherein the step of marking the heat sink comprises marking the heat sink with position markings based on a position of a lens of the concentrated photovoltaic module.

11. The method according to claim 1, wherein the assembling of the photovoltaic cell assembly on the heat sink is realized by means of gluing and/or laser welding.

* * * * *